(12) United States Patent
Zhao

(10) Patent No.: US 11,322,485 B2
(45) Date of Patent: May 3, 2022

(54) MASS TRANSFER METHOD FOR LIGHT-EMITTING UNIT, ARRAY SUBSTRATE, AND DISPLAY DEVICE WITH ELECTRO-CURABLE ADHESIVE

(71) Applicant: BOE TECHNOLOGY GROUP CO., LTD., Beijing (CN)

(72) Inventor: Chengtan Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/904,412

(22) Filed: Jun. 17, 2020

(65) Prior Publication Data

US 2021/0005582 A1   Jan. 7, 2021

(30) Foreign Application Priority Data

Jul. 4, 2019   (CN) .......................... 201910599982.3

(51) Int. Cl.
| | |
|---|---|
| *H01L 33/38* | (2010.01) |
| *H01L 23/00* | (2006.01) |
| *H01L 25/075* | (2006.01) |
| *H01L 25/16* | (2006.01) |

(Continued)

(52) U.S. Cl.
CPC .......... *H01L 25/0753* (2013.01); *H01L 24/32* (2013.01); *H01L 24/97* (2013.01); *H01L 25/167* (2013.01); *H01L 33/62* (2013.01); *H01L 33/06* (2013.01); *H01L 33/385* (2013.01); *H01L 2224/832* (2013.01); *H01L 2224/83855* (2013.01); *H01L 2933/0066* (2013.01)

(58) Field of Classification Search
CPC ..... H01L 24/97; H01L 25/167; H01L 33/385; H01L 2224/83855
See application file for complete search history.

(56) References Cited

U.S. PATENT DOCUMENTS

| | | | |
|---|---|---|---|
| 2013/0256735 A1* | 10/2013 | Kim ....................... H01L 33/44 | 257/99 |
| 2014/0027709 A1* | 1/2014 | Higginson .......... H01L 25/0753 | 257/13 |
| 2017/0133550 A1* | 5/2017 | Schuele .............. H01L 33/0093 | |

(Continued)

*Primary Examiner* — Ismail A Muse
*Assistant Examiner* — Gustavo G Ramallo
(74) *Attorney, Agent, or Firm* — Womble Bond Dickinson (US) LLP

(57) ABSTRACT

The present disclosure relates to the field of display, specifically, to a mass transfer method for a light-emitting unit, an array substrate, and a display device. The method comprises: providing a plurality of light-emitting units in an array, wherein each light-emitting unit comprises a first electrode extending to a side edge of the light-emitting unit; providing a base substrate comprising a plurality of areas in an array, each area comprising a second electrode and an electro-curable adhesive thereon; picking up the light-emitting units by a transfer device; applying voltages to the first and second electrodes respectively; aligning the transfer device with the base substrate, such that a portion of each first electrode extending to the side edge of the light-emitting unit contacts a respective electro-curable adhesive; and separating the transfer device from the light-emitting units, such that each light-emitting unit is transferred to a respective area of the base substrate.

16 Claims, 3 Drawing Sheets

(51) Int. Cl.
*H01L 33/62* (2010.01)
*H01L 33/06* (2010.01)

(56) References Cited

U.S. PATENT DOCUMENTS

| | | | |
|---|---|---|---|
| 2018/0037773 A1* | 2/2018 | Umetsu | H01L 33/641 |
| 2020/0064736 A1* | 2/2020 | Yang | G03F 7/0047 |
| 2021/0111325 A1* | 4/2021 | Kim | H01L 24/83 |

* cited by examiner

MASS TRANSFER METHOD FOR LIGHT-EMITTING UNIT, ARRAY SUBSTRATE, AND DISPLAY DEVICE WITH ELECTRO-CURABLE ADHESIVE

RELATED APPLICATION(S)

The present application claims the benefit of Chinese Patent Application No. 201910599982.3, filed Jul. 4, 2019, the entire disclosure of which is incorporated herein by reference.

TECHNICAL FIELD

The present disclosure relates to the field of display, and in particular, to a mass transfer method for a light-emitting unit, an array substrate, and a display device.

BACKGROUND ART

A micro light-emitting diode (Micro-LED) is a micro LED obtained by thinning and miniaturizing a conventional LED structure, and its volume is about 1% of that of a conventional LED. When micro-LEDs are applied to a display panel as light-emitting units, each pixel of the display panel comprising a micro-LED array can be controlled and driven to emit light separately. The pitch (on a micron scale) of the micro-LED array is much smaller than that of a conventional LED array, which facilitates realization of higher pixels per inch (PPI), higher brightness, and higher color saturation of the display panel. At present, one of the major technical difficulties limiting the wide application of micro-LEDs is the mass transfer technique for transferring a micro-LED array to a base substrate, and an urgent technical problem to be solved in the mass transfer technique is how to improve the accuracy of alignment.

SUMMARY

According to one aspect of the present disclosure, a mass transfer method for a light-emitting unit is provided, the mass transfer method comprising steps of: providing a plurality of light-emitting units in an array, wherein each of the plurality of light-emitting units comprises a first electrode, and the first electrode extends to a side edge of the light-emitting unit; providing a base substrate, wherein the base substrate comprises a plurality of areas in an array, each of the plurality of areas comprising a second electrode and an electro-curable adhesive on the second electrode; picking up the plurality of light-emitting units by a transfer device; applying a first voltage to the first electrode; applying a second voltage to the second electrode; aligning the transfer device with the base substrate, such that a portion of each first electrode extending to the side edge of the light-emitting unit is in contact with a respective electro-curable adhesive; and separating the transfer device from the plurality of light-emitting units, such that each of the plurality of light-emitting units is transferred to a respective one of the plurality of areas of the base substrate.

According to a specific implementation, in the mass transfer method for a light-emitting unit provided by an embodiment of the present disclosure, the light-emitting unit comprises a micro light-emitting diode (micro-LED).

According to a specific implementation, in the mass transfer method for a light-emitting unit provided by an embodiment of the present disclosure, the electro-curable adhesive comprises one or more of 3-[4-(bromomethyl)phenyl]-3-(trifluoromethyl)-diazirine, PAMAM-g-diazirine, vinyl ester diazonium salts, and vinylics.

According to a specific implementation, in the mass transfer method for a light-emitting unit provided by an embodiment of the present disclosure, a voltage difference between the first voltage and the second voltage falls within a range of 0.5V-5V According to a specific implementation, in the mass transfer method for a light-emitting unit provided by an embodiment of the present disclosure, the electro-curable adhesive is formed by screen printing.

According to a specific implementation, in the mass transfer method for a light-emitting unit provided by an embodiment of the present disclosure, the step of aligning the transfer device with the base substrate comprises: moving the transfer device relative to the base substrate in a first direction perpendicular to the base substrate and/or in a second direction parallel to the base substrate.

According to a specific implementation, in the mass transfer method for a light-emitting unit provided by an embodiment of the present disclosure, each light-emitting unit further comprises a third electrode and a luminescent layer between the first electrode and the third electrode.

According to a specific implementation, in the mass transfer method for a light-emitting unit provided by an embodiment of the present disclosure, the luminescent layer comprises a quantum well luminescent layer.

According to a specific implementation, in the mass transfer method for a light-emitting unit provided by an embodiment of the present disclosure, the first electrode is a cathode, and the third electrode is an anode.

According to another aspect of the present disclosure, an array substrate is further provided. The array substrate comprises: a base substrate, comprising a plurality of areas in an array; a plurality of second electrodes, each of which is located in a respective one of the plurality of areas; a plurality of electro-curable adhesives, each of which is located on a respective one of the plurality of second electrodes; a plurality of light-emitting units, each of which is located in a respective one of the plurality of areas, wherein each light-emitting unit comprises a first electrode, and the first electrode extends to a side edge of the light-emitting unit; wherein a portion of each first electrode extending to the side edge of the light-emitting unit is in contact with a respective electro-curable adhesive.

According to a specific implementation, in the array substrate provided by an embodiment of the present disclosure, the light-emitting unit comprises a micro-LED.

According to a specific implementation, in the array substrate provided by an embodiment of the present disclosure, the electro-curable adhesive comprises one or more of 3-[4-(bromomethyl)phenyl]-3-(trifluoromethyl)-bis-aziridine, polyamide-g-bis-aziridine, vinyl ester diazonium salts, and vinylics.

According to a specific implementation, in the array substrate provided by an embodiment of the present disclosure, each light-emitting unit further comprises a third electrode and a luminescent layer between the first electrode and the third electrode, wherein the luminescent layer comprises a quantum well luminescent layer.

According to a specific implementation, in the array substrate provided by an embodiment of the present disclosure, each light-emitting unit further comprises a first semiconductor layer, a second semiconductor layer, and a third semiconductor layer. Specifically, the third semiconductor layer is located on a side of the luminescent layer facing the third electrode, the second semiconductor layer is located on a side of the luminescent layer facing away from the third electrode, the first semiconductor layer is located in a same layer as at least a portion of the second semiconductor layer, and the portion of the first electrode extending to the side edge of the light-emitting unit comprises a portion of the first electrode covering a sidewall of the first semiconductor layer.

According to a specific implementation, in the array substrate provided by an embodiment of the present disclosure, the first electrode is a cathode, and the third electrode is an anode.

According to yet another aspect of the present disclosure, a display device is further provided. The display device comprises the array substrate described in any of the above embodiments.

BRIEF DESCRIPTION OF DRAWINGS

Embodiments of the present disclosure will be further described in a non-restrictive manner with reference to the drawings, where.

DETAILED DESCRIPTION OF EMBODIMENTS

Figure 1:
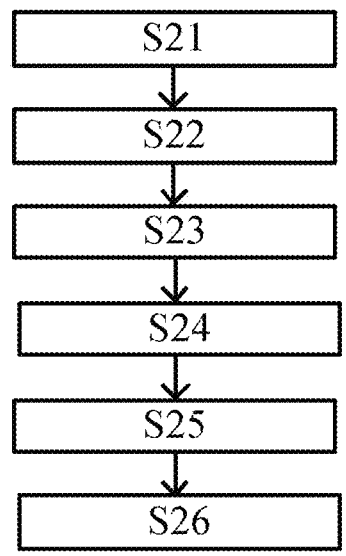
FIG. 1 schematically shows a flow chart of a mass transfer method for a light-emitting unit according to an embodiment of the present disclosure.

As mentioned above, a micro-LED is a micro LED obtained by thinning and miniaturization of a conventional LED structure. As similar to an organic light-emitting diode (OLED), a micro-LED shows characteristics, such as self-luminosity and no backlight. As compared with a display panel consisting of OLEDs, a display panel consisting of micro-LEDs has higher display resolution, higher color saturation, and longer service life. Micro-LEDs can be applied in fields such as wearable devices, large indoor display screens, head-mounted displays (HMD), head-up displays (HUD), rear lights, wireless optical communications Li-Fi, AR/VR and projectors.

During encapsulation process, a conventional LED is usually transferred by vacuum adsorption. Since the size of each micro-LED is usually smaller than that of a vacuum tube for vacuum adsorption of a conventional LED, the vacuum adsorption method for conventional LEDs is no longer suitable for the transference of micro-LEDs.

At present, the mass transfer method for micro-LEDs comprises for example a fine pick/place mass transfer method, a selective release mass transfer method, and a self-assembly mass transfer method. The fine pick/place mass transfer method is a mass transfer method often used currently, and it usually comprises a film transfer method and an electrostatic adsorption transfer method. Both transfer methods are going to pick up a plurality of micro-LEDs arranged in an array from a base substrate by a transfer device, and then transfer them to a further base substrate. As an example, a film transfer method for micro-LEDs generally comprises steps of: aligning a transfer device (e.g., which can be an elastic stamp comprising a polydimethylsiloxane (PDMS) material for example) with the micro-LEDs and rapidly pressing it down; deforming the transfer device and bring it into close contact with the micro-LEDs; rapidly lifting the transfer device, such that the micro-LEDs are separated from a first base substrate; aligning the transfer device with a second base substrate; rapidly pressing down the transfer device against the second base substrate; and slowly lifting the transfer device to separate it from the micro-LEDs. It should be noted that, in the mass transfer method for micro-LEDs, the transfer device usually picks up at one time a plurality of micro-LEDs arranged in an array.

Usually, the fine pick/place mass transfer method improves the alignment accuracy of the transferred micro-LEDs by improving the alignment accuracy of the transfer device. However, the alignment accuracy of the transfer device usually only achieves an alignment accuracy of 10-20 μm due to limitations in mechanical alignment, etc., which is not quite desirable yet. For example, when the micro-LEDs are transferred to the second base substrate with low alignment accuracy, an undesirable position deviation of the micro-LEDs will be caused. Such position deviation will usually lead to two disadvantages: on one hand, in a subsequent distribution process of gate lines and data lines, the position deviation of the micro-LEDs will result in different contact areas between the gate lines or the data lines and the respective micro-LEDs, thus resulting in different contact resistances; on the other hand, if the position deviation of the micro-LEDs is very large, it will be necessary to increase not only the line width of gate lines and data lines but also the size of pins on the micro-LEDs (for the purpose of stopping the gate lines/data lines with increased line width from covering the light-emitting area of the micro-LEDs) so as to enable the electrical connection between the gate lines/data lines and the respective micro-LEDs, which will increase the occupation area of each micro-LED and go against the realization of a high-resolution display panel.

In view of the above disadvantages of the mass transfer method, embodiments of the present disclosure provide an improved mass transfer method for a light-emitting unit. By optimizing the mass transfer method for a light-emitting unit by means of the electro-curable characteristics of the electro-curable adhesive, the alignment accuracy between the light-emitting unit and the base substrate can be improved.

The mass transfer method for a light-emitting unit according to embodiments of the present disclosure will be explained and illustrated in more detail with reference to the drawings. It should be pointed out that the mass transfer method for a light-emitting unit according to some embodiments of the present disclosure is only shown in the drawings exemplarily and introduced in detail in the description below. However, none of the exemplary drawings and description should be considered as any limitation to the present disclosure. In fact, having benefited from the technical teaching of the present disclosure, those skilled in the art will be able to conceive of other suitable alternatives upon actual situations.

Figure 2:
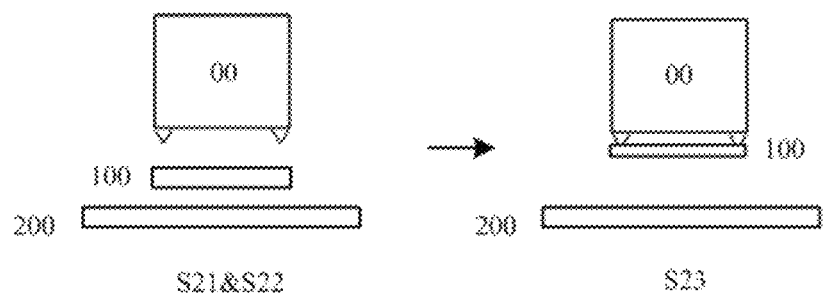
FIG. 2 schematically shows a partial schematic view of a mass transfer method for a light-emitting unit according to an embodiment of the present disclosure.
Figure 2:
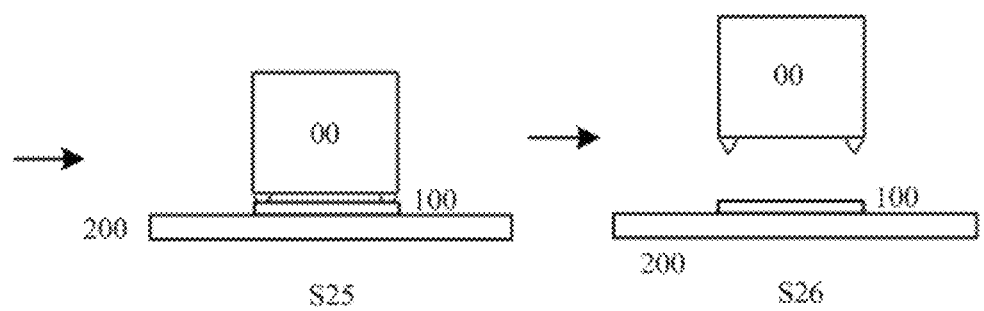
Figure 3:
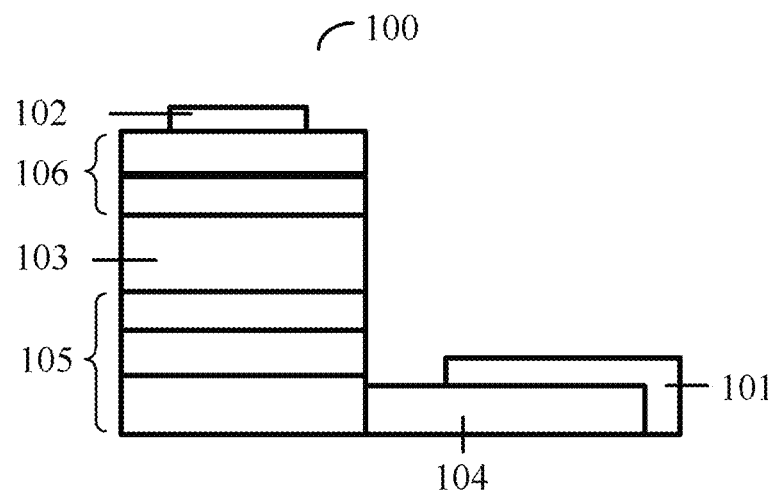
FIG. 3 schematically shows a section view of a light-emitting unit according to an embodiment of the present disclosure.
Figure 4:
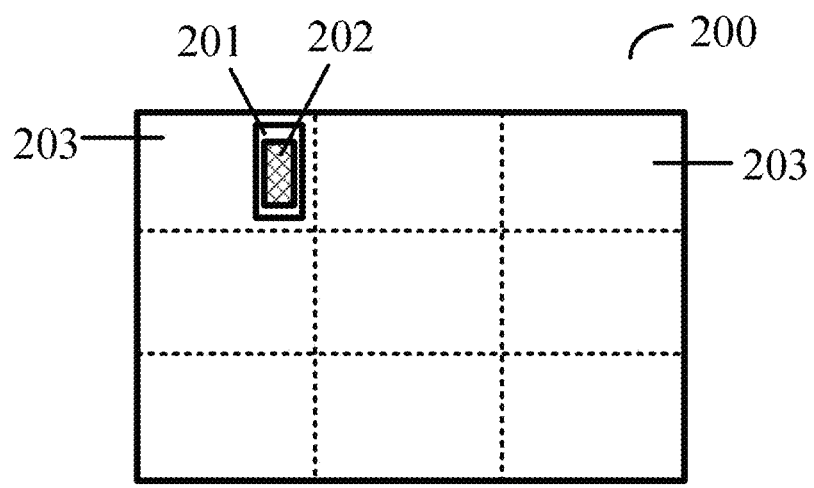
FIG. 4 schematically shows a section view of a base substrate according to an embodiment of the present disclosure.

FIG. 1 and FIG. 2 schematically show a flow chart and a partial schematic view of a mass transfer method for a light-emitting unit according to embodiments of the present disclosure respectively, FIG. 3 schematically shows a section view of a light-emitting unit according to an embodiment of the present disclosure, and FIG. 4 schematically shows a section view of a base substrate according to an embodiment of the present disclosure. With reference to FIG. 1, FIG. 2, FIG. 3 and FIG. 4, the mass transfer method for a light-emitting unit comprises steps of: S21, providing a plurality of light-emitting units 100 arranged in an array, wherein each of the plurality of light-emitting units 100 comprises a first electrode 101, wherein the first electrodes 101 extends to a side edge of the light-emitting unit 100; S22, providing a base substrate 200, wherein the base substrate 200 comprises a plurality of areas 203 arranged in an array, each of the plurality of areas 203 comprising a second electrode 201 and an electro-curable adhesive 202 on the second electrode 201; S23, picking up the plurality of light-emitting units 100 by a transfer device 00; S24, applying a first voltage (which e.g. can be a negative voltage) to the first electrode 101 and applying a second voltage (which e.g. can be a positive voltage) to the second electrode 201; S25, aligning the transfer device 00 with the base substrate 200, such that a portion of each first electrode 101 extending to the side edge of the respective light-emitting unit 100 is in contact with a respective electro-curable adhesive 202; and S26, separating the transfer device 00 from the plurality of light-emitting units 100, such that each of the plurality of light-emitting units 100 is transferred to a respective one of the plurality of areas 203 of the base substrate 200.

As a specific example, according to an embodiment of the present disclosure, in the mass transfer method for a light-emitting unit, the step S25 of aligning the transfer device with the base substrate 200 comprises a sub-step of: moving the transfer device relative to the base substrate 200 in a first direction perpendicular to the base substrate 200 and/or in a second direction parallel to the base substrate 200. For example, the transfer device can be moved up or down with relative to the base substrate 200 by a distance of 5 μm in the first direction perpendicular to the base substrate 200 and/or to left or right with relative to the base substrate 200 by a distance of 5 μm in the second direction parallel to the base substrate 200. Obviously, the moving distances listed above as examples are only provided to schematically illustrate the present disclosure, rather than limit it in any sense.

As a specific implementation, the alignment between the transfer device and the base substrate 200 can be divided into preliminary alignment and fine alignment. During the preliminary alignment between the transfer device and the base substrate 200, the transfer device is aligned with the base substrate 200 and moved towards the base substrate 200, until the pitch between the micro-LEDs and the base substrate 200 is very small (e.g., several hundred microns). Then, during the fine alignment between the transfer device and the base substrate 200, the transfer device is moved relative to the base substrate 200 in a first direction perpendicular to the base substrate 200 and/or in a second direction parallel to the base substrate 200, such that a portion of each first electrode 101 extending to the side edge of the respective light-emitting unit 100 is brought in contact with a respective electro-curable adhesive 202. Therefore, in the mass transfer method for a light-emitting unit according to an embodiment of the present disclosure, the preliminary alignment is achieved by using the alignment accuracy of the transfer device, and the fine alignment narrows the alignment accuracy further by bringing a portion of each first electrode 101 extending to a side edge of the light-emitting unit 100 into contact with a respective electro-curable adhesive 202. Thereby, the alignment accuracy between the micro-LEDs and the base substrate 200 can be further improved.

For example, the mass transfer method for a light-emitting unit provided by an embodiment of the present disclosure can be combined with the film transfer method described above. In other words, the light-emitting units 100 according to an embodiment of the present disclosure can be mass transferred by using the film transfer method described above, and during the alignment between the transfer device and the base substrate 200, a portion of each first electrode 101 extending to a side edge of the light-emitting unit 100 is brought into contact with a respective electro-curable adhesive 202.

As can be understood from the above description, in the mass transfer method for a light-emitting unit provided by an embodiment of the present disclosure, if the transfer device is not aligned with the base substrate 200 or the misalignment is quite considerable, the portion of the first electrode 101 extending to the side edge of the light-emitting unit 100 will not be brought into contact with the respective electro-curable adhesive 202. As a result, the voltage difference between the first electrode 101 and the second electrode 201 will not be applied to the electro-curable adhesive 202, and thus the electro-curable adhesive 202 will not be cured. In this case, the light-emitting units 100 are not transferred to a position within a desired accuracy range, and thus, the sub-step of step S25 as described above can be executed, i.e., moving the transfer device relative to the base substrate 200 in a first direction perpendicular to the base substrate 200 and/or in a second direction parallel to the base substrate 200. Only if the portion of each first electrode 101 extending to the side edge of the light-emitting unit 100 is brought into contact with a respective electro-curable adhesive 202, can the electro-curable adhesive 202 be cured due to the voltage difference between the first electrodes 101 and the second electrodes 201. This means that the light-emitting units 100 have been transferred to a position within the desired accuracy range.

As a specific example, in an embodiment of the present disclosure, the light-emitting diode 100 may be a micro-LED. FIG. 3 is a section view of a micro-LED. With reference to FIG. 3, the first electrode 101 of the micro-LED extends to a side edge of the micro-LED, and such a structural design helps to bring the first electrode 101 into contact with the electro-curable adhesive 202 in the mass transfer method for a light-emitting unit. For example, in this embodiment, the micro-LED may further comprise a third electrode 102 and a luminescent layer 103 between the third electrode 102 and the first electrode 101. The luminescent layer 103 may comprise a quantum well luminescent layer. As a specific example, the first electrode 101 may be a cathode, and the third electrode 102 may be an anode. The specific structure of the micro-LED will be introduced in detail in description of the structure of array substrate 300 below, which will not be elaborated herein.

Figure 5:
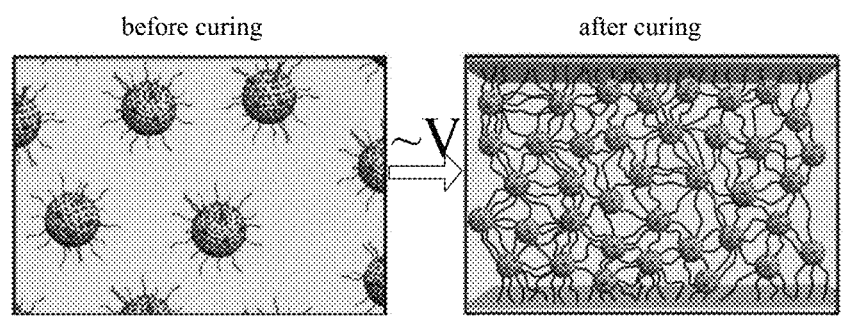
FIG. 5 schematically shows a schematic view of a curing process for an electro-curable adhesive according to an embodiment of the present disclosure.

FIG. 4 is a schematic view of a base substrate 200 according to an embodiment of the present disclosure. As shown in FIG. 4, the base substrate 200 comprises a plurality of areas 203 arranged in an array, each of which comprises a second electrode 201 and an electro-curable adhesive 202 on the second electrode 201. FIG. 5 schematically shows a schematic view of a curing process for an electro-curable adhesive according to an embodiment of the present disclosure. The electro-curable adhesive 202 used in the mass transfer method for a light-emitting unit will be described in detail with reference to FIG. 4 and FIG. 5.

The electro-curable adhesive 202 may comprise one or more of 3-[4-(bromomethyl)phenyl]-3-(trifluoromethyl)-diazirine, PAMAM-g-diazirine, vinyl ester diazonium salts, and vinylics. Besides, when the electro-curable adhesive 202 comprises a specified material listed above, a proportion (e.g., Mole percent) of the specified material in the entire electro-curable adhesive 202 can be selected flexibly upon actual needs. For example, when the electro-curable adhesive 202 comprises PAMAM-g-diazirine, the time required for curing the electro-curable adhesive 202 can be adjusted by changing a proportion (e.g., 5%, 10%, 15%) of the PAMAM-g-diazirine in the entire electro-curable adhesive 202. Usually, the higher the proportion of the PAMAM-g-diazirine in the electro-curable adhesive 202 is, the longer time the electro-curable adhesive 202 requires for curing. Apparently, the materials and/or proportion values listed above as examples are only provided to schematically illustrate the present disclosure, rather than limit it in any sense.

The electro-curable adhesive 202 formed by such a material has the characteristic of electro-curability, and can be usually cured at a very small voltage difference. In an implementation, the curing voltage of the electro-curable adhesive 202 may fall within a range of 0.5V-5V. In other words, the voltage difference between the first voltage applied to the first electrode 101 and the second voltage applied to the second electrode 201 may fall within the range of 0.5V-5V. For instance, in a specific implementation, the curing voltage of the electro-curable adhesive 202 may be 2V. FIG. 5 is a schematic view of the curing process for an electro-curable adhesive 202. As shown in FIG. 5, the drawing on the left shows the electro-curable adhesive 202 before curing (i.e., no voltage is applied to the electro-curable adhesive 202), and the drawing on the right shows the electro-curable adhesive 202 after curing (i.e., a suitable voltage is applied to the electro-curable adhesive 202). As can be seen from FIG. 5, before curing of the electro-curable adhesive 202, molecules within the electro-curable adhesive 202 are independent of each other; after a suitable voltage is applied to the electro-curable adhesive 202, cross-linking polymerization reactions take place between molecules within the electro-curable adhesive 202, thereby forming a spatial network structure. As compared with the uncured electro-curable adhesive 202, the cured electro-curable adhesive 202 usually has characteristics such as higher hardness, stronger heat resistance and better wear resistance. Therefore, in the mass transfer method for a light-emitting unit 100 provided by embodiments of the present disclosure, whether the micro-LEDs have been transferred to a position within the desired accuracy range can be determined by determining whether the electro-curable adhesive 202 is cured. That is, in the mass transfer method for a light-emitting unit 100 provided by embodiments of the present disclosure, the electro-curable adhesive 202 is mainly used to identify the position where the light-emitting unit 100 should be transferred.

Since the electro-curable adhesive 202 can be cured at a lower voltage, adverse effects of electrostatic discharge (ESD) generated by high voltage on the micro-LEDs can be avoided. Besides, as compared with the traditional thermal curing method or UV light curing method, the electro-curable characteristic of the electro-curable adhesive 202 can help to avoid adverse effects of high temperature (e.g., 250° C.) in thermal curing or UV light in light curing on the micro-LEDs (e.g., reducing the lighting efficiency of micro-LEDs).

As a specific implementation, the required electro-curable adhesive 202 may be formed by a screen printing process for example. Of course, formation of the electro-curable adhesive 202 is not limited thereto, and the electro-curable adhesive 202 required in embodiments of the present disclosure can be formed by any suitable process.

In an optional embodiment, the second electrode 201 is only used to provide a second voltage differing from the voltage at the first electrode 101, so as to form a suitable voltage difference, such that the electro-curable adhesive 202 is cured when the portion of the first electrode 101 extending to the side edge of the micro-LED is in contact with the electro-curable adhesive 202. After a plurality of micro-LEDs are mass transferred to the base substrate 200, two electrode lines for connecting the first electrode 101 and the third electrode 102 of the micro-LEDs can be formed on the base substrate 200 by a photolithography process for example, so as to drive the micro-LEDs to emit light. Alternatively, in another optional embodiment, the second electrode 201 may also be reused as an electrode line for connecting to one of the first electrode 101 and the third electrode 102 of the micro-LEDs. That is, during the mass transfer, the second electrode 201 is used to provide a second voltage, such that the electro-curable adhesive 202 is cured when the portion of the first electrode 101 extending to the side edge of the micro-LED is in contact with the electro-curable adhesive 202. After a plurality of micro-LEDs are mass transferred to the base substrate 200, the second electrode 201 is electrically connected to one of the first electrode 101 and the third electrode 102 of the micro-LEDs as an electrode line, and a further additionally fabricated electrode line is electrically connected to the other of the first electrode 101 and the third electrode 102, so as to drive the micro-LEDs to emit light.

It is clear from above that embodiments of the present disclosure provide a novel mass transfer method for a light-emitting unit. During the mass transfer, a portion of each first electrode 101 extending to the side edge of the light-emitting unit 100 is brought in contact with a respective electro-curable adhesive 202, and whether each of the micro-LEDs has been transferred to a position within the desired accuracy range in a respective area 203 is found by determining whether the electro-curable adhesive 202 is cured. In the mass transfer method for a light-emitting unit provided by embodiments of the present disclosure, considering the alignment accuracy of the transfer device, the alignment range is further narrowed by aligning each of the first electrodes 101 with a respective electro-curable adhesive 202. This further improves the alignment accuracy between the micro-LEDs and the base substrate 200.

According to another aspect of the present disclosure, an array substrate is further provided. Next, referring to FIG. 6 and FIG. 7, the array substrate 300 according to embodiments of the present disclosure will be described in detail.

The array substrate 300 comprises: a base substrate 200, comprising a plurality of areas 203 arranged in an array; a plurality of second electrodes 201, wherein each of the plurality of second electrodes 201 is located in a respective one of the plurality of areas 203; a plurality of electro-curable adhesives 202, wherein each of the plurality of electro-curable adhesives 202 is located on a respective one of the plurality of second electrodes 201; a plurality of light-emitting units 100, wherein each of the plurality of light-emitting units 100 is located in a respective one of the plurality of areas 203, wherein each light-emitting unit comprises a first electrode 101, and the first electrode 101 extends to a side edge of the light-emitting unit 100; wherein a portion of each first electrode 101 extending to the side edge of the light-emitting unit 100 is in contact with a respective electro-curable adhesive 202.

In a specific implementation, the light-emitting unit 100 may be a micro-LED for example. Returning to FIG. 3, in contrast with the conventional electrode arrangement, the first electrode 101 in FIG. 3 extends to a side edge of the micro-LED. Such arrangement of the first electrode 101 helps to bring the first electrode 101 into contact with a respective electro-curable adhesive 202 during mass transfer of the micro-LEDs, i.e., to bring a portion of the first electrode 101 extending to the side edge of the micro-LED into contact with a respective electro-curable adhesive 202. As shown in FIG. 3, the micro-LED may further comprise a third electrode 102 and a luminescent layer 103 between the first electrode 101 and the third electrode 102. In this example, the first electrode 101 may be a cathode of the micro-LED, and the third electrode 102 may be an anode of the micro-LED. The luminescent layer 103 may comprise a quantum well luminescent layer, e.g., an InGaN quantum well luminescent layer. Usually, each of the plurality of areas 203 of the base substrate 200 comprises at least two electrode pins (not shown), wherein one of the at least two electrode pins is electrically connected with a first electrode 101 of a respective micro-LED, and the other of the at least two electrode pins is electrically connected with a third electrode 102 of a respective micro-LED. By applying suitable voltages to the first electrode 101 and the third electrode 102 respectively, the micro-LED can be driven such that the luminescent layer 103 emits light. Besides, the micro-LED shown in FIG. 3 may further comprise a first semiconductor layer 104, a second semiconductor layer 105, and a third semiconductor layer 106. It should be pointed out that these semiconductor layers may be single layers, or multi-layers consisting of multiple film layers. For example, in this example, the first semiconductor layer 104 may be a P-type GaN layer, and the second semiconductor layer 105 may comprise an N-type InGaN layer, an N-type AlGaN layer, and an N-type GaN layer. Besides, the third semiconductor layer 106 may comprise a P-type GaN layer and a P-type AlGaN layer. Obviously, one skilled in the art can flexibly choose any other suitable material upon specific applications.

Figure 6:
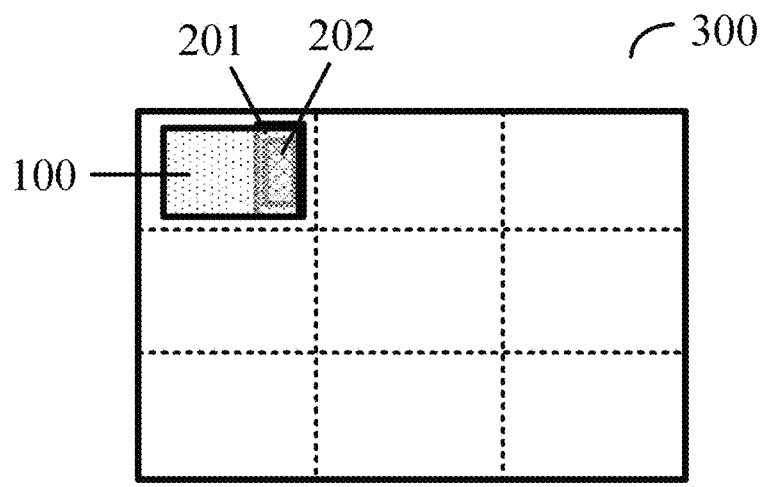
FIG. 6 schematically shows a section view of an array substrate according to an embodiment of the present disclosure, and FIG. 7 schematically shows a partial side view of the array substrate in FIG. 6.
Figure 7:
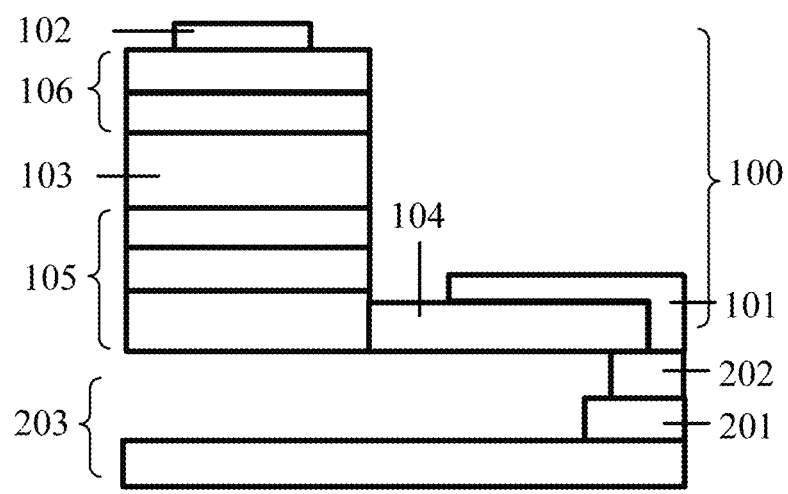

Continuously referring to FIG. 6 and FIG. 7, in the array substrate 300 according to an embodiment of the present disclosure, the second electrode 201 and the electro-curable adhesive 202 are located on the base substrate 200. Specifically, the second electrode 201 may be an indium tin oxide (ITO) electrode, which can be formed by a photolithography process. The second electrode 201 may be connected to a power supply at an outer edge of the base substrate 200, for example by leads.

The electro-curable adhesive 202 has the characteristic of curability at a suitable voltage difference. Since the portion of the first electrode 101 extending to the side edge of the light-emitting unit 100 is in contact with a respective electro-curable adhesive 202, in this case, the voltage difference between the first electrode 101 and the second electrode 201 cures the electro-curable adhesive 202. That is, in the array substrate 300 according to an embodiment of the present disclosure, the electro-curable adhesive 202 is an already cured electro-curable adhesive. The electro-curable adhesive 202 may comprise one or more of 3-[4-(bromomethyl) phenyl]-3-(trifluoromethyl)-diazirine, PAMAM-g-diazirine, vinyl ester diazonium salts, and vinylics. Apparently, one skilled in the art can further choose any other suitable material flexibly upon specific applications and practice requirements. In this aspect, the present disclosure will not provide detailed introductions any more. However, it is intended to cover all these conceivable technical solutions.

It should be noted that in order to clearly describe the structure of the array substrate 300, only a part of the structure is shown in the example of FIG. 6 and FIG. 7. However, one skilled in the art should clearly know that the structure of the array substrate 300 is not limited thereto, and the array substrate 300 may further comprise structures, such as a plurality of gate lines and a plurality of data lines intersecting each other, and thin film transistors located within each area 203, wherein all these structures cooperate with each other to achieve the required functions of the array substrate 300.

In the array substrate 300 provided by an embodiment of the present disclosure, the alignment accuracy between the light-emitting unit 100 and the base substrate 200 in the array substrate 300 is improved by optimizing the light-emitting unit 100 and the base substrate 200 in structure. Specifically, in the array substrate 300 according to an embodiment of the present disclosure, a portion of each first electrode 101 extending to the side edge of the light-emitting unit 100 is brought in contact with a respective electro-curable adhesive 202, such that each light-emitting unit 100 is located at a position within the desired accuracy range in a respective area 203. In other words, the array substrate 300 according to an embodiment of the present disclosure is an array substrate obtained by narrowing the alignment range further based on the alignment accuracy of the existing transfer device. Therefore, as compared with an array substrate obtained by using a conventional mass transfer method, the array substrate 300 provided by embodiments of the present disclosure can effectively improve the alignment accuracy between the light-emitting unit 100 and the base substrate 200.

According to yet another aspect of the present disclosure, a display device is further provided. Such a display device comprises the array substrate described in any of the above embodiments. The display device can be any suitable device such as wearable devices, large indoor display screens, head-mounted displays (HMD), head-up displays (HUD), rear lights, wireless optical communications Li-Fi, AR/VR and projectors. Since the display device can solve substantially the same technical problems as the array substrate mentioned above and achieve the same technical effects, the technical effects of the display device will not be repeated herein for simplicity.

One skilled in the art will understand that the term "substantially" herein can further comprise embodiments of "entirely", "completely", "all" and so on. Therefore, in the embodiments, the adjective "substantially" can be removed. In a suitable case, the term "substantially" can further involve 90% or higher, such as 95% or higher, and particularly 99% or higher, or even more particularly 99.5% or higher, including 100%. The term "comprise" further comprises embodiments in which the term "comprise" means "consist of". The term "and/or" in particular involves one or more of the items mentioned before and after "and/or". For example, the phrase "item 1 and/or item 2" and similar phrases can involve one or more of item 1 and item 2. The term "comprise" may mean "consist of" in one embodiment, but it may also mean "include at least the defined object and optionally one or more other objects" in another embodiment.

Besides, the terms such as "first", "second" and "third" in both the description and the claims are used to distinguish between similar elements rather than necessarily describe the sequentially or the temporal sequence. It should be understood that the terms used as such are exchangeable in a suitable case, and the embodiments of the present disclosure described herein can be operated in sequences other than the one described or explained herein.

It should be pointed out that the embodiments mentioned above are used to explain the present disclosure rather than limit it, and one skilled in the art can design many alternative embodiments without deviating from the scope of the appended claims. In the claims, any reference sign placed within parentheses should not be construed as limiting the claims. The use of the verb "comprise" and inflections thereof do not exclude the presence of elements or steps other than those recited in the claims. The article "a" or "an" before an element does not exclude the presence of a plurality of such elements. The mere fact that certain measures are recited in mutually different dependent claims does not indicate that a combination of these measures cannot be used to advantage.

Various aspects discussed in this patent can be combined to provide additional advantages. Furthermore, some of the features can form the basis of one or more divisional applications.

LIST OF REFERENCE SIGNS 00 transfer device
100 light-emitting unit
101 first electrode
102 third electrode
103 luminescent layer
104 first semiconductor layer
105 second semiconductor layer
106 third semiconductor layer
200 base substrate
201 second electrode
202 electro-curable adhesive
203 areas in an array
300 array substrate.

The invention claimed is:

1. A mass transfer method for a light-emitting unit, comprising:
providing a plurality of light-emitting units in an array, wherein each of the plurality of light-emitting units comprises a first electrode, and the first electrode extends to a side edge of the light-emitting unit, wherein each light-emitting unit further comprises a third electrode, a luminescent layer between the first electrode and the third electrode, a first semiconductor layer, a second semiconductor layer, and a third semiconductor layer, wherein the luminescent layer comprises a quantum well luminescent layer, and wherein the third semiconductor layer is located on a side of the luminescent layer facing the third electrode, the second semiconductor layer is located on a side of the luminescent layer facing away from the third electrode, the first semiconductor layer is located in a same layer as at least a portion of the second semiconductor layer, and the portion of the first electrode extending to the side edge of the light-emitting unit comprises a portion of the first electrode covering a sidewall of the first semiconductor layer;
providing a base substrate, wherein the base substrate comprises a plurality of areas in an array, each of the plurality of areas comprising a second electrode and an electro-curable adhesive on the second electrode;
picking up the plurality of light-emitting units by a transfer device;
applying a first voltage to the first electrode;
applying a second voltage to the second electrode;
aligning the transfer device with the base substrate, such that a portion of each first electrode extending to the side edge of the light-emitting unit is in contact with a respective electro-curable adhesive; and
separating the transfer device from the plurality of light-emitting units, such that each of the plurality of light-emitting units is transferred to a respective one of the plurality of areas of the base substrate.

2. The mass transfer method according to claim 1, wherein the light-emitting unit comprises a micro light-emitting diode (micro-LED).

3. The mass transfer method according to claim 1, wherein the electro-curable adhesive comprises one or more of 3-[4-(bromomethyl)phenyl]-3-(trifluoromethyl)-diazirine, PAMAM-g-diazirine, vinyl ester diazonium salts, and vinylics.

4. The mass transfer method according to claim 1, wherein a voltage difference between the first voltage and the second voltage falls within a range of 0.5V-5V.

5. The mass transfer method according to claim 1, wherein the electro-curable adhesive is formed by screen printing.

6. The mass transfer method according to claim 1, wherein the step of aligning the transfer device with the base substrate comprises: moving the transfer device relative to the base substrate in a first direction perpendicular to the base substrate and/or in a second direction parallel to the base substrate.

7. The mass transfer method according to claim 1, wherein the luminescent layer comprises a quantum well luminescent layer.

8. The mass transfer method according to claim 1, wherein the first electrode is a cathode and the third electrode is an anode.

9. An array substrate, comprising:
a base substrate, comprising a plurality of areas in an array;
a plurality of second electrodes, each of which is located in a respective one of the plurality of areas;
a plurality of electro-curable adhesives, each of which is located on a respective one of the plurality of second electrodes;
a plurality of light-emitting units, each of which is located in a respective one of the plurality of areas, wherein each light-emitting unit comprises a first electrode, and the first electrode extends to a side edge of the light-emitting unit;
wherein a portion of each first electrode extending to the side edge of the light-emitting unit is in contact with a respective electro-curable adhesive;
wherein each light-emitting unit further comprises a third electrode, a luminescent layer between the first electrode and the third electrode, a first semiconductor layer, a second semiconductor layer, and a third semiconductor layer;
wherein the luminescent layer comprises a quantum well luminescent layer, and
wherein the third semiconductor layer is located on a side of the luminescent layer facing the third electrode, the second semiconductor layer is located on a side of the luminescent layer facing away from the third electrode, the first semiconductor layer is located in a same layer as at least a portion of the second semiconductor layer, and the portion of the first electrode extending to the side edge of the light-emitting unit comprises a portion of the first electrode covering a sidewall of the first semiconductor layer.

10. The array substrate according to claim 9, wherein the light-emitting unit comprises a micro light-emitting diode (micro-LED).

11. The array substrate according to claim 9, wherein the electro-curable adhesive comprises one or more of 3-[4-(bromomethyl)phenyl]-3-(trifluoromethyl)-diazirine, PAMAM-g-diazirine, vinyl ester diazonium salts, and vinylics.

12. The array substrate according to claim 9, wherein the first electrode is a cathode and the third electrode is an anode.

13. A display device, comprising the array substrate according to claim 9.

14. The display device according to claim 13, wherein the light-emitting unit comprises a micro light-emitting diode (micro-LED).

15. The display device according to claim 13, wherein the electro-curable adhesive comprises one or more of 3-[4-(bromomethyl)phenyl]-3-(trifluoromethyl)-diazirine, PAMAM-g-diazirine, vinyl ester diazonium salts, and vinylics.

16. The display device according to claim 13, wherein the first electrode is a cathode and the third electrode is an anode.

* * * * *